US007954926B2

(12) United States Patent
Bertelsen et al.

(10) Patent No.: US 7,954,926 B2
(45) Date of Patent: Jun. 7, 2011

(54) HYDROPHOBIC NOZZLE PLATE STRUCTURES FOR MICRO-FLUID EJECTION HEADS

(75) Inventors: Craig Michael Bertelsen, Union, KY (US); Christopher Allen Craft, Paris, KY (US); Bryan Thomas Fannin, Versailles, KY (US); David Christopher Graham, Lexington, KY (US); Kelly Ann Killeen, Lexington, KY (US); Bart Allan Mansdorf, Lexington, KY (US); Sean Terrance Weaver, Union, KY (US); Xiaoming Wu, Strongsville, OH (US)

(73) Assignee: Lexmark International, Inc., Lexington, KY (US)

( * ) Notice: Subject to any disclaimer, the term of this patent is extended or adjusted under 35 U.S.C. 154(b) by 723 days.

(21) Appl. No.: 12/018,357

(22) Filed: Jan. 23, 2008

(65) Prior Publication Data

US 2009/0185003 A1 Jul. 23, 2009

(51) Int. Cl.
*B41J 2/14* (2006.01)

(52) U.S. Cl. .......................................... 347/47; 347/46
(58) Field of Classification Search .................... 347/47, 347/70–71, 40, 43, 45–46
See application file for complete search history.

(56) References Cited

U.S. PATENT DOCUMENTS

| 4,306,245 | A | 12/1981 | Kasugayama et al. |
| 4,571,375 | A | 2/1986 | Benedikt |
| 5,005,024 | A | 4/1991 | Takahashi et al. |
| 5,350,616 | A | 9/1994 | Pan et al. |
| 6,151,045 | A | 11/2000 | Beach et al. |
| 6,283,589 | B1 * | 9/2001 | Gelbart ........................ 347/101 |
| 6,345,880 | B1 | 2/2002 | DeBoer et al. |

FOREIGN PATENT DOCUMENTS

EP 0942026 A2 9/1999

* cited by examiner

*Primary Examiner* — Lamson D Nguyen

(57) ABSTRACT

A nozzle plate for a micro-fluid ejection head, a method of making a hydrophobic nozzle plate, and a method for improving the resiliency of a nozzle plate. The nozzle has a photo-imageable hydrophobic polycyclic polyolefin layer derived from an epoxy functionalized polynorbornene.

9 Claims, 6 Drawing Sheets

000
HYDROPHOBIC NOZZLE PLATE STRUCTURES FOR MICRO-FLUID EJECTION HEADS

TECHNICAL FIELD

The disclosure relates to hydrophobic nozzle plates for micro-fluid ejection heads, and in particular to materials that improve the resiliency of the nozzle plates with respect to maintaining hydrophobic properties for the life of the ejection heads.

BACKGROUND AND SUMMARY

The degree of hydrophobicity/hydrophilicity of a micro-fluid ejection head plays an important role in the overall performance of a micro-fluid ejection device. As the size of the nozzles in nozzle plates shrinks in order to get smaller droplet sizes, the sensitivity of the fluid ejected to the surface energy of the nozzle plate increases dramatically. One factor that may effect the ejection of fluids from the nozzle plate may be the accumulation of fluid or other contaminants on the nozzle plate surface. Such accumulation of fluid on the nozzle plate may adversely affect both the size and placement accuracy of the fluid droplets ejected from the ejection head.

A temporary solution to providing a hydrophobic nozzle plate is the periodic application of an anti-wetting solvent to the nozzle plate. However the anti-wetting solvent is not permanent and must be reapplied. Accordingly, there is a need for a photodefinable nozzle plate that has suitable, substantially permanent hydrophobic characteristics and is at least as resilient as polyimide nozzle plate materials.

With regard to the foregoing, exemplary embodiments of the disclosure may provide, a nozzle plate for a micro-fluid ejection head, a method of making a hydrophobic nozzle plate, and a method for improving the resiliency of a nozzle plate. The nozzle has a photoimageable hydrophobic polycyclic polyolefin layer derived from an epoxy functionalized polynorbornene.

In another exemplary embodiment, there is provided a method for providing a hydrophobic nozzle plate for a micro-fluid ejection head. The method includes photoimaging a polycyclic polyolefin layer derived from an epoxy functionalized polynorbornene applied to a micro-fluid ejection head structure. The photoimaged layer is developed to provide nozzles therein wherein an exposed surface of the layer is essentially hydrophobic.

Yet another exemplary embodiment provides a method for improving the resiliency of a nozzle plate for a micro-fluid ejection head. The method includes photoimaging a polycyclic polyolefin layer derived from an epoxy functionalized polynorbornene applied to a micro-fluid ejection head structure. The photoimaged layer is then developed to provide nozzles therein.

Advantages of the use of the specific hydrophobic materials described herein include, but are not limited to, the fact that norbornene-based polymers have extremely high glass transition temperature (Tg) (typically >250° C.), low moisture absorption, excellent solvent resistance, good adhesion to a number of substrates, high thermal stability (5% wt. loss in a thermogravimetric analysis >300° C.), low tensile modulus, and higher elongation compared to epoxy novolac photoimageable materials. However, most notably, norbornene-based polymers typically exhibit a high degree of hydrophobicity due to their almost exclusive hydrocarbon nature. Accordingly, incorporating the norbornene-based polymers in the nozzle plate materials according to the disclosure has provided a unique solution to the wettability and resiliency problems associated with conventional photoimageable materials used for micro-fluid ejection head applications.

BRIEF DESCRIPTION OF THE DRAWINGS

Further advantages of the exemplary embodiments may become apparent by reference to the detailed description of the exemplary embodiments when considered in conjunction with the following drawing illustrating one or more non-limiting aspects of thereof, wherein like numerals refer to similar features, and wherein.

DETAILED DESCRIPTION OF EXEMPLARY EMBODIMENTS

Figure 1:
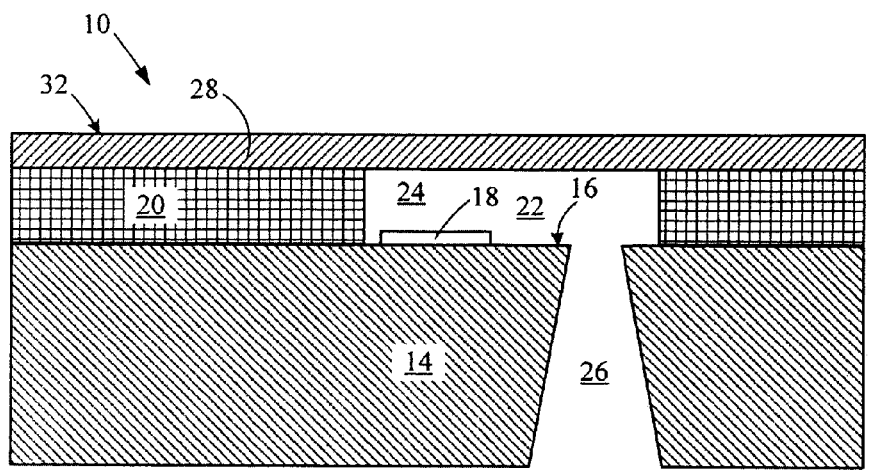
FIGS. 1-9 are cross-sectional views, not to scale, of portions of micro-fluid ejection heads during processes for applying hydrophobic coating layers to the ejection heads.

In the disclosed embodiments a polycyclic polyolefin compounds is used to provide substantially permanent hydrophobic nozzle plate characteristics. Suitable polycyclic polyolefin compounds for the purposes of this disclosure are the compounds derived from a functionalized polynorbornene represented by the following formula (I):

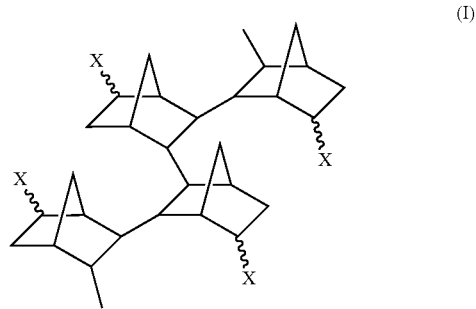

wherein X may be selected from a reactive or non-reactive group. Common X groups include, but are not limited to, acetate, alcohol, $C_1$ to $C_{10}$ alkyl, aldehyde, anhydride, epoxide, ester, ether, ketone, nitrile, silyl ether, phenyl and the like.

An epoxy-functionalized polynorbornene of formula (I) may be used similar to other photoimageable materials. For example, the epoxy-functionalized polynorbornene of formula (I) may be dissolved in a solvent with a photoacid generator (or photoinitiator). Since the epoxy-functionalized polynorbornene is a negative-tone photodefinable polymer, once exposed to ultraviolet (UV) light, the material undergoes a crosslinking reaction. That is, UV-absorption of the photoinitiator generates a superacid which initiates a ring opening polymerization of epoxy-functionalized polynorbornenes. The resulting product is an insoluble high molecular weight, crosslinked polymer. The reaction of the epoxy-functionalized polynorbornene polymer to UV light is shown in by the following reaction sequence.

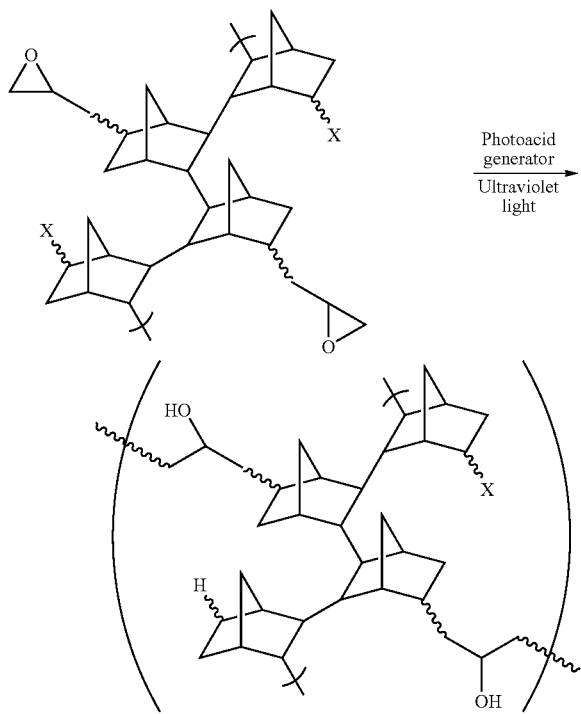

An example of such a commercially available epoxy-functionalized polynorbornene is available from Promerus LLC of Brecksville, Ohio under the trade name AVATREL. Polymeric materials made from the foregoing materials may have number average molecular weights ranging from about 40,000 to about 80,000 or more.

As set forth above, polycyclic polyolefins (and more specifically polynorbornenes or PNBs) possess a number of desirable physical properties for use in constructing micro-fluid ejection heads. For example, the high degree of hydrophobicity exhibited by the PNBs, in combination with the other desirable physical properties, provides a means for solving problems associated with photoimageable nozzle plates that eliminates the need to incorporate fluorine- or silicone-functional groups into a photoimageable formulation. Conventional photodefinable materials that incorporate fluorine- or silicone-functional groups are disadvantageous to use because of an increased complexity of synthesis of monomers/polymers, incompatibility with other materials in the ejection head, and phase separation of the fluorine- or silicone-functionalized monomers before curing. By contrast, the hydrophobicity of PNBs arises from the very high hydrocarbon ($-CH_2-$) content of the polymeric backbone and lack of highly polarizable or electronegative atoms (such as oxygen, nitrogen, and the like).

Nevertheless, the PNBs described herein may be further functionalized to alter their hydrophobicity depending on the application or use of the polymers in the micro-fluid ejection head. For example, specific functional groups may be incorporated as side chains on the epoxy-functionalized polynorbornenes to increase or decrease the hydrophobicity of the resulting nozzle plate. In order to make the resulting nozzle plate more hydrophilic, groups such as alcohols, esters, ethers, ketones, or nitrile groups may be incorporated in the side chains. Alternatively, although PNBs are hydrophobic without specific functionalization, it is possible to further enhance the degree of hydrophobicity of the nozzle plate by incorporating side chains such as aromatic or aliphatic hydrocarbon groups, silicones, or fluorinated hydrocarbons.

The PNBs also display the desirable properties of being completely amorphous and are very thermally stable. Such properties are due to the chemical structure of the backbone in the polymer (depicted in formula I). The polynorbornene is comprised of only hydrocarbon bonds ($-CH_2-$) in a bicyclic geometry. Such a polymeric repeat unit possesses tremendous steric hindrance upon rotation around any of the bonds in the backbone. Steric hindrance is the source of the polymer's physical properties, specifically its high glass transition temperature (Tg) and amorphous morphology.

The PNBs described herein may be processed in a manner similar to the other photoimageable materials. For example, the PNBs may be formulated with a photoinitiator or photoacid generator selected from a compound or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating acid moieties which initiate reactions with epoxides. The photoacid generator may be present in a PNB photoimageable formulation in an amount ranging from about 0.5 to about 15 weight percent based on the weight of the cured resin.

Examples of triaryl-substituted sulfonium complex salt photoinitiators which may be used in the formulations according to the exemplary embodiments include, but are not limited to:
triphenylsulfonium tetrafluoroborate
triphenylsulfonium hexafluorophosphate
triphenylsulfonium hexafluoroantimonate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluoroantimonate
4-acetoxy-phenyldiphenylsulfonium tetrafluoroborate
4-acetamidophenyldiphenylsulfonium tetrafluoroborate Of the triaryl-substituted sulfonium complex salts which are suitable for use in the PNB photoimageable formulations, one salt is a mixture of triarylsulfonium hexafluoroantimonate salt, commercially available from Dow Chemical Corporation under the trade name CYRACURE UVI-6974.

The PNB photoimageable formulations may use the same i-line photolithography equipment for processing, and may be coated onto a micro-fluid ejection head structure in a variety of ways typical for applying photoimageable materials to such structures. For example, the PNB photoimageable formulations may be spin-coated, spray-coated, or dry film laminated to the structures.

A PNB photoimageable formulation that may be used for spin coating or spray coating onto a nozzle plate layer for a micro-fluid ejection head may include the following ingredients in the amounts indicated: from about 40 to about 70 weight percent carrier solvent (such as 2-heptanone or 2-pentanone), from about 25 to about 50 weight percent cyclic olefin polymer, and from about 0.5 to about 15 weight percent photoacid generator based on a total weight of the formulation.

A PNB photoimageable formulation that may be used to provide a dry film laminate for a nozzle plate for a micro-fluid ejection head may have the following ingredients in the amounts indicated: less than about 10 percent by weight carrier solvent, from about 75 to about 98 weight percent cyclic olefin polymer, and from about 0.5 to about 15 weight percent photoacid generator based on a total weight of the PNB formulation. For a multilayered dry film laminate, the same proportions are applicable for the primary layer of the dry film. Other layers within that dry film photodefinable laminate formula may contain the same or different PNB polymer or another photodefinable material (such as an epoxy-Novolac resin) in similar proportions.

In another embodiment of the disclosure, the PNBs may be functionalized so that they are compatible with polyimide and conventional novolac epoxy photoimageable materials. In such embodiment, the PNBs need not be photodefinable materials. Such PNBs may be applied as a conventional topcoat layer to a polyimide or photoimageable nozzle plate material to provide a hydrophobic coating. Another advantage of using the PNB material as a coating on a nozzle plate is that the material may also function as a top antireflective coating that may eliminate secondary reflections when imaging the nozzle layer beneath the coating. When used as a topcoat layer on a nozzle plate, the PNB material may be cured at the same time as the nozzle plate layer or may be cured in a separate curing step after curing the nozzle plate layer.

Accordingly, the PNB materials described herein may have thickness ranging from about 0.02 to about 50 microns depending on whether the material is used a hydrophobic coating to an existing nozzle plate or as a nozzle plate structure itself.

In order to demonstrate the non-wettability properties of hydrophobic nozzle plates according to the disclosure, the following non-limiting examples are provided.

Example 1

For the purposes of this example, a PNB material under the trade name AVATREL 2585P was coated and cured on a blank silicon wafer. The PNB formulation included a photoacid generator and was spin coated onto the blank silicon wafer. The material was soft-baked at 120° C. for 5 minutes, exposed to UV radiation to polymerize/crosslink the material, and put through a post-exposure bake cycle at 90° C. for 4 minutes. Water contact angle measurements were performed on the wafer containing the PNB polymer material and were compared to the water contact angles of a conventional novolac epoxy photoimageable nozzle plate and a prior art hydrophobic nozzle plate. The results of the water contact angle measurements are shown in the following table.

TABLE 1

| Property | Novolac Epoxy Nozzle Plate | Prior Art Hydrophobic Nozzle Plate | PNB Polymer Nozzle Plate |
|---|---|---|---|
| Water Contact Angle (degrees) | 71.9 | 81.0 | 96.8 |
| Standard Deviation | 4.7 | 0.8 | 0.8 |

According to the water contact angle determinations shown in the foregoing table, PNB nozzle plate material is significantly more hydrophobic than both the novolac epoxy photoimageable nozzle plate material. Also, the PNB polymer material has a much smaller standard deviation for the water contact angle measurements than the other nozzle plates tested indicating a more consistent surface.

Besides the benefits associated with fluid ejection provided by PNB nozzle plates according to the disclosure, there may also be a number of secondary benefits by using the hydrophobic PNB-type materials as a coating or nozzle plate material. A more hydrophobic nozzle plate may widen the selection of materials used as sealing tape adhesives for sealing the nozzle plates during storage and shipping. With conventional novolac epoxy photoimageable nozzle plates, the peel strength of the pressure sensitive adhesive (PSA) tape used for sealing the nozzle holes is often too high. The high peel strength of the PSA tape, combined with the brittle nature of the epoxy-novolac based polymers has resulted in the PSA tape actually damaging the nozzle plate or a portion of the nozzle plate when the PSA tape was removed.

It is believed that the more hydrophobic PNB nozzle plate material will decrease adhesion between the nozzle plate and the PSA tape. Accordingly, the peel strength window for PSA tapes may widen. Moreover, it is expected that the more resilient (less brittle nature) of PNB nozzle plate materials compared to epoxy-novolac polymers should further aid in tape removal from the nozzle plate. By decreasing the modulus of the nozzle plate, it is expected that the tolerance of the nozzle plate to higher peel strength PSA tapes may be increased.

Physical properties of the PNB material described above compared to a bisphenol-A (BPA) based epoxy novolac photoimageable polymers are given in the following table.

TABLE 2

| Physical Property | PNB material Nozzle plate | BPA epoxy novolac Nozzle Plate |
|---|---|---|
| Tensile modulus (MPa) | 1600 | 2997 |
| Tensile Strength (MPa) | 38 | 25 |
| Elongation at Break (%) | 10 | 1 |
| Glass Transition Temperature (° C.) | 295 | 150 |
| 5 wt. % loss by TGA (° C.) | 292 | 354 |

As shown by the comparison in the foregoing table, the PNB material displays similar thermally stability and has a higher glass transition temperature than the prior art bisphenol-A (BPA) based epoxy novolac photoimageable material. The improved thermal properties of the PNB material may provide processing benefits, such as an ability to use higher temperatures and cure times during wafer processing, and additional shelf life stability. The high Tg of the PNB material may also facilitate the use of heat-activated (or hot melt adhesive) tapes for sealing the nozzle plate. Temperatures between 120° and 150° C. for commonly used hot-melt adhesives are too high for the BPA based epoxy novolac photoimageable materials as they overlap or go beyond the Tg of such materials. However, the high Tg's of PNB materials may enable the application of such hot melt adhesives without the worry of deformation of the nozzle plate due to material flow.

Another potential benefit of using the PNB material as a coating or nozzle plate layer is that since the PNB material is more hydrophobic than the prior art materials, a less frequent, more robust maintenance cycle may be used thereby increasing the fluid ejection speed and lifetime of the fluid ejection head. Since the surface of the nozzle plate is more hydrophobic with the use of the PNB materials, fluid-puddling on the nozzle plate may be a less frequent event thereby decreasing the need for maintenance wipes to remove accumulated fluid. Also, since the PNB material is less brittle and more robust than the epoxy novolac photoimageable materials, the nozzle plates may be less prone to defects caused by mechanical shear such as during a maintenance wipe of the nozzle plate.

Methods for incorporating hydrophobic PNB materials into micro-fluid ejection heads, such as ejection head 10, will now be described with reference to FIGS. 1-9. In FIG. 1, a substrate 14 is provided having a device surface 16 containing a plurality of fluid ejection devices such as heater resistors 18 thereon. A thick film layer 20, typically an epoxy photoimageable material layer is applied to the device surface 16 of the substrate 14. A photolithographic process is used to image and develop a fluid supply channel 22 and a fluid ejection chamber 24 in the thick film layer 20 to provide a fluid path to the heater resistors 18 from a fluid supply slot 26 etched through the substrate 14.

Figure 2:
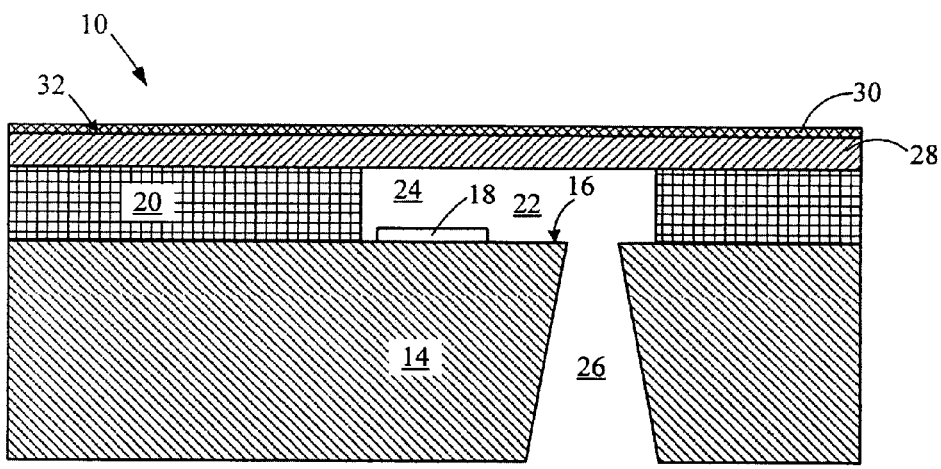

Next, a nozzle plate layer 28 made of polyimide or an epoxy functionalized photoimageable material is applied to the thick film layer 20 by spin coating, lamination, adhesive, or other suitable process. In one embodiment, the nozzle plate layer 28 is an epoxy photoimageable material that has a thickness ranging from about 2 to about 50 microns. Prior to forming nozzle holes in the nozzle plate layer 28, a polynorbornene photoimageable layer 30 is applied to a surface 32 of the nozzle plate layer 28 as shown in FIG. 2. The polynorbornene may be applied by spin coating or spray coating the polynorbornene onto the surface 32 of the nozzle plate layer 28 to provide a hydrophobic surface having a thickness ranging from about 0.5 to about 5 microns.

In an alternative process, a photoimageable nozzle plate layer having a thickness ranging from about 2 to about 50 microns and a polynorbornene having a thickness ranging from about 0.5 to about 50 microns are co-extruded onto a release liner. Alternatively, a thick polynorbornene, having a thickness ranging from about 2 to about 50 microns, may be coextruded with another photodefinable polymer, having a thickness of from about 0.5 to about 5 microns, to generate the coextruded dry-film. In a further alternative process, the photoimageable nozzle plate having an overall thickness of from about 2 to about 50 microns may be provided by a dry film composite material that include a first layer of hydrophobic polynorbornene and a second layer selected from an epoxy resin and a hydrophilic polynorbornene. The coextruded layers 26 and 28 are then dry film laminated to the thick film layer 20 using heat and/or pressure.

In yet another alternative process, a nozzle plate layer having a thickness of 2 to about 50 microns is applied as a dry film laminate to the thick film layer 20. A polynorbornene layer having a thickness of 0.5 to 5 microns is then applied to the nozzle plate layer as a dry film laminate.

Figure 3:
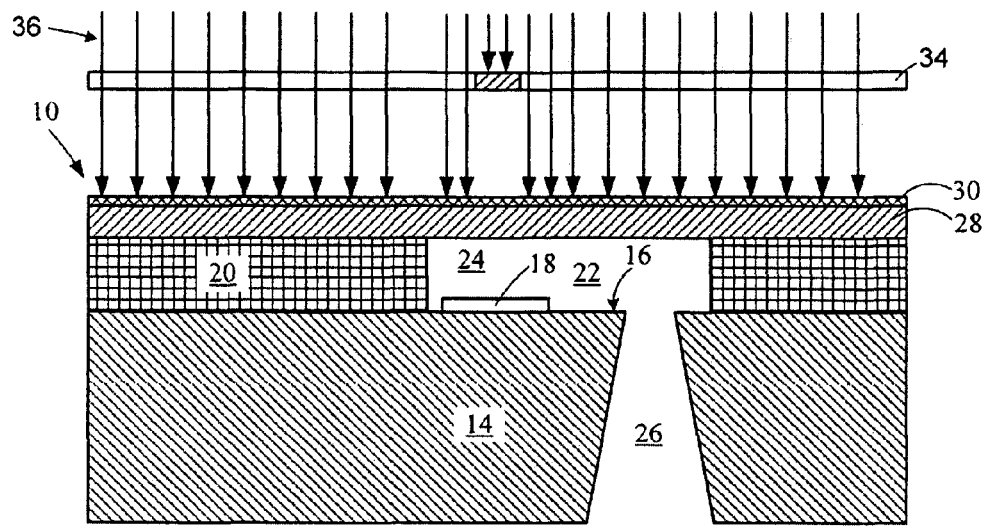
Figure 4:
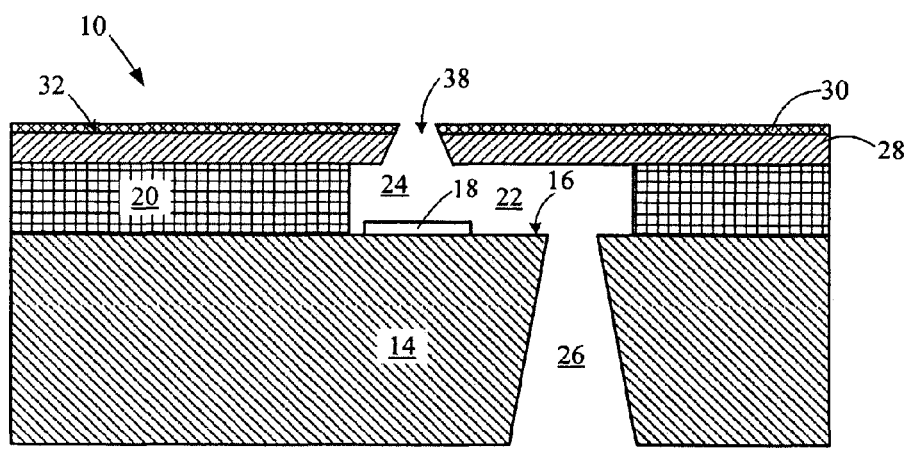

In one embodiment, the two layer structure 28/30 is exposed through a mask 34 to UV radiation 36 and is developed to provide nozzle holes 38 therein as shown in FIGS. 3 and 4. In another embodiment, the nozzle plate layer 28 is exposed through the mask 34 prior to applying the polynorbornene layer 30 to the surface 32 of the nozzle plate layer 28. In the second embodiment, the polynorbornene layer 30 is exposed to the UV radiation 36 through the mask 34 in a separate exposure step. The nozzle plate layer 28 and the polynorbornene layer 30 are then simultaneously developed to provide the nozzle holes 38.

Figure 5:
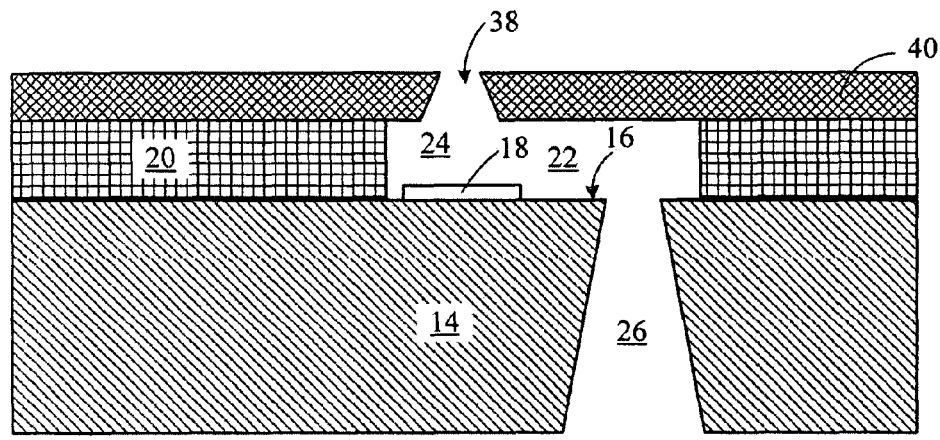
Figure 6:
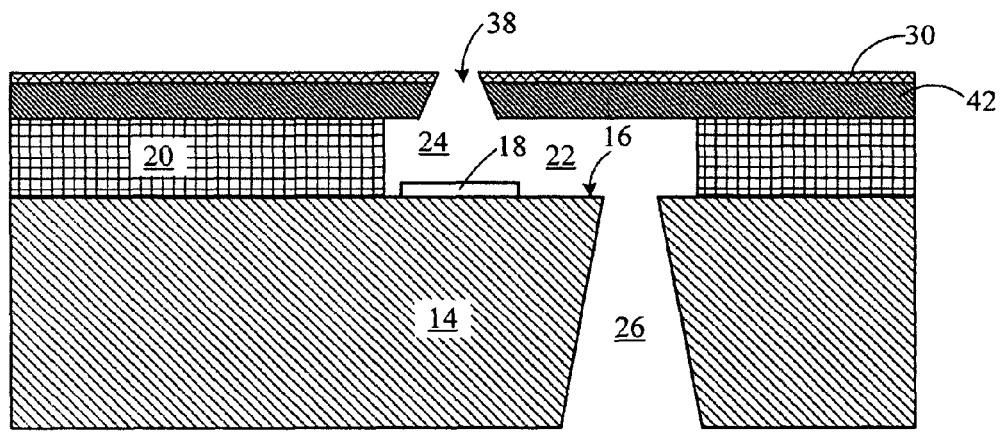

Another embodiment of the disclosure is illustrated in FIGS. 5-6. In FIG. 5 an entire nozzle plate layer 40 is made of a polynorbornene-based photoimageable material having a thickness ranging from about 2 to about 50 microns. The layer 40 may be applied to the thick film layer 20 as a dry film laminate as described above. If the wettability of the fluid chamber 24 and flow channel 22 are of concern, a two layer polynorbornene dry film laminate including a hydrophilic polynorbornene layer 42 having a thickness of from about 2 to about 50 microns and the hydrophobic polynorbornene layer 30 having a thickness of from about 0.5 to 5 microns may be applied as a dry film laminate to the thick film layer 20. The two layer composite 30/42 may then be imaged and developed simultaneously to provide the nozzle holes 38 as described above. The hydrophilic polynorbornene layer 42 may be made by providing alcohols or esters as functional groups on the polynorbornene.

Figure 7:
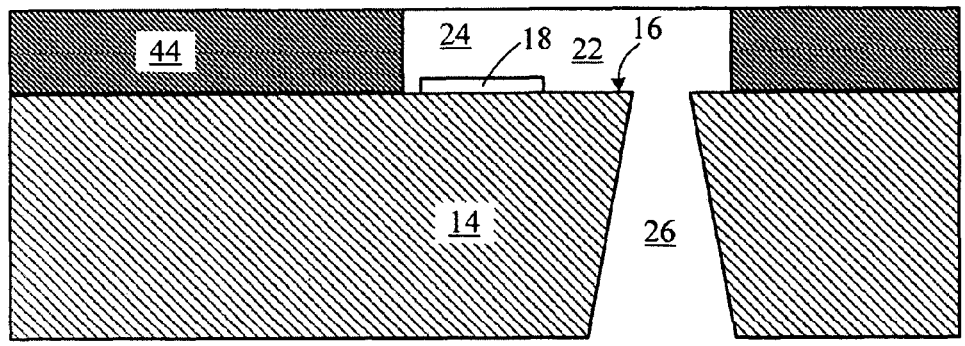

In an alternative to all of the embodiments described above, a hydrophilic polynorbornene thick film layer 44 may be used in place of layer 20 as shown in FIG. 7. The polynorbornene thick film layer 44 may be spin coated, spray coated, or laminated as a dry film to the devices surface 16 of the substrate 14. The layer 44 would then be exposed to UV radiation and developed as described above to provide a hydrophilic thick film layer 44. Any of the foregoing embodiments may then be used to provide a hydrophobic nozzle plate layer for the micro-fluid ejection head.

Figure 8:
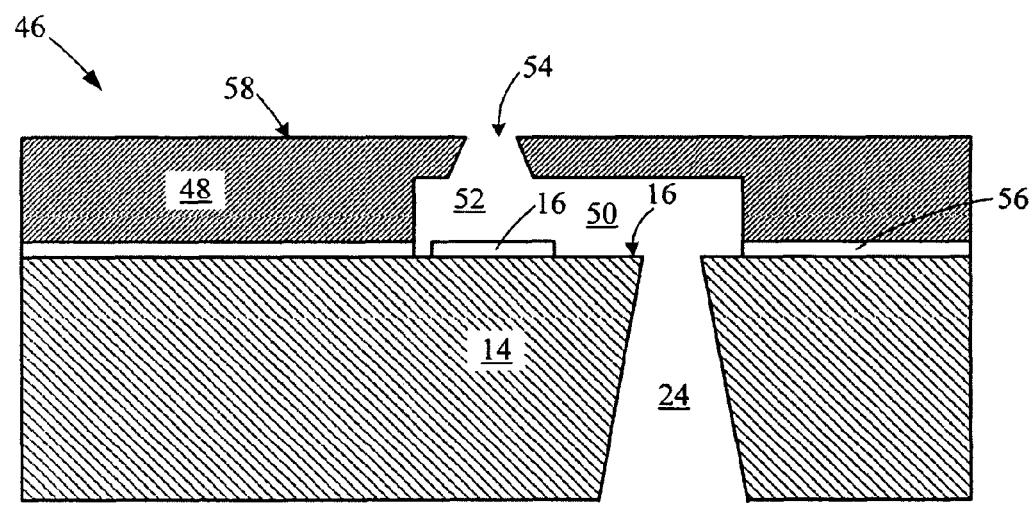
Figure 9:
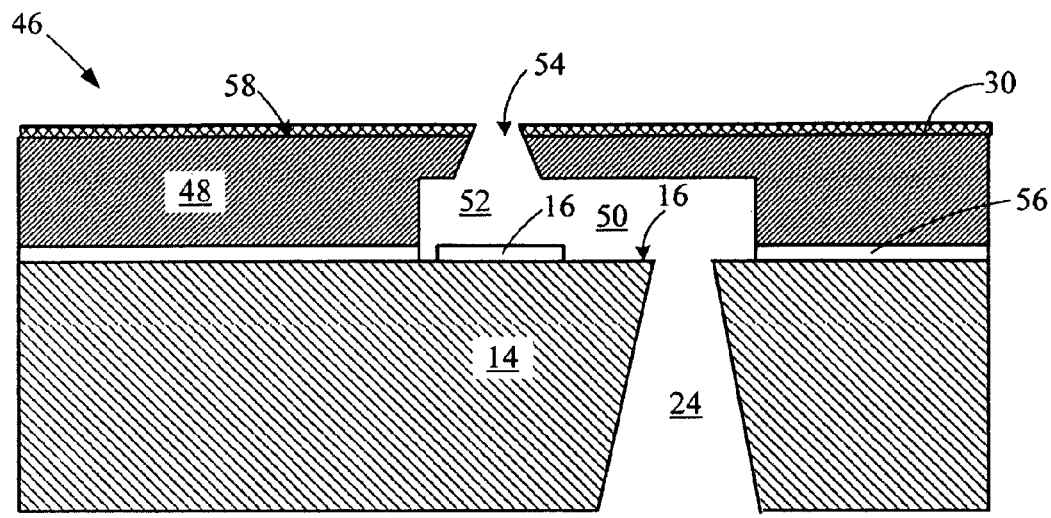

FIGS. 8 and 9 illustrate the construction of an ejection head 46 to which a hydrophobic layer is attached when a polyimide material is used to provide a nozzle plate. In this example, a nozzle plate layer 48 is made of a polyimide material that is laser ablated to form fluid flow channels 50, fluid ejection chambers 52 and nozzle holes 54 therein prior to attaching the nozzle plate layer 48 to the devices surface 16 of the substrate 14 by use of an adhesive 56. A hydrophobic PNB material may be applied to a surface 58 of the nozzle plate layer 48 as shown in FIG. 9 by a dry film lamination process to provide the hydrophobic layer 30 as described above. The hydrophobic layer 30 may then be imaged and developed to provide the nozzle holes 54 therein.

Figure 10:
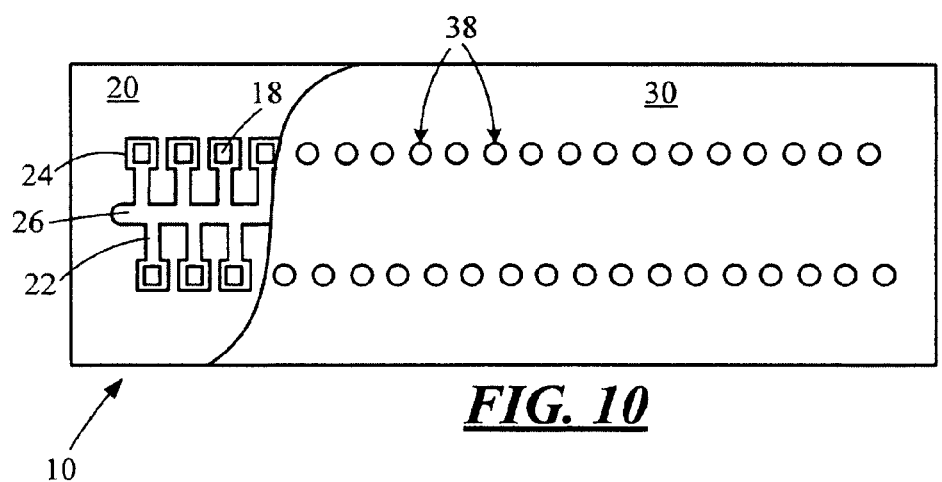
FIG. 10 is a plan view, not to scale, of a micro-fluid ejection head having a hydrophobic layer on a nozzle plate therefor.
Figure 11:
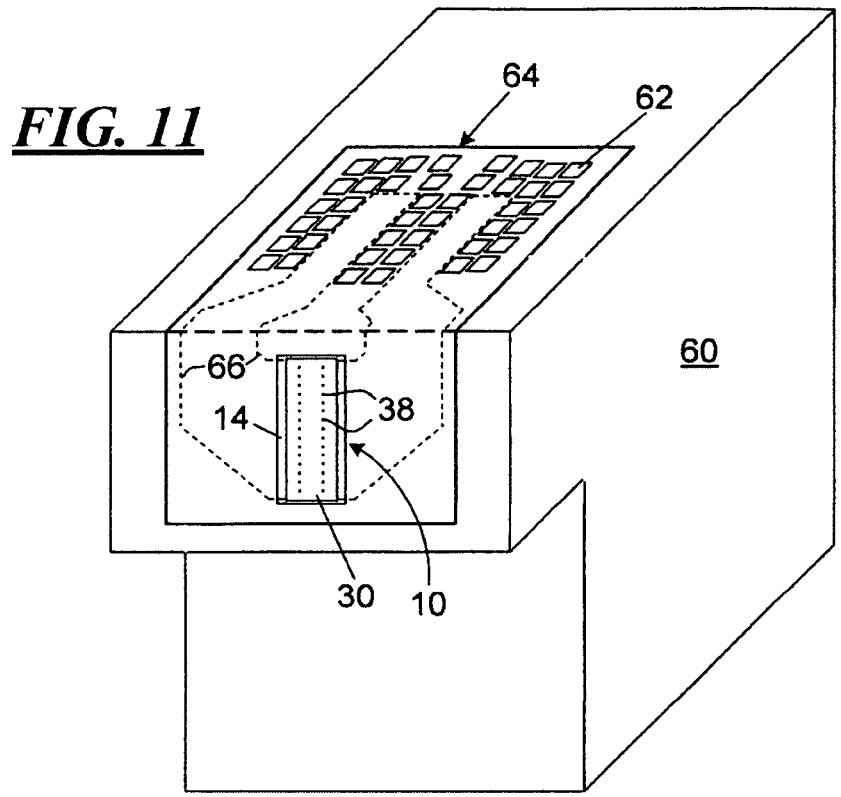
FIG. 11, is a perspective view, not to scale, of a fluid supply cartridge for a micro-fluid ejection head according to the disclosure.
Figure 12:
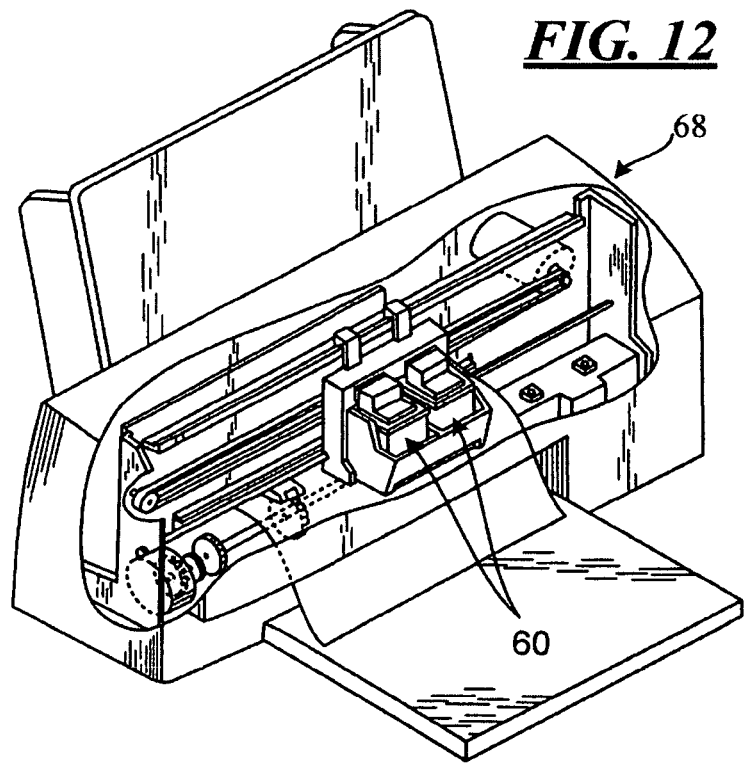
FIG. 12 is a perspective view of a device for ejecting fluid from a micro-fluid ejection head according to the disclosure.

A plan view of the ejection head 10 made according to the disclosure is illustrated in FIG. 10. As described above, the ejection head 10 includes a hydrophobic nozzle plate layer 30 that is attached to the thick film layer 20. The ejection head 10 may be attached to a fluid supply cartridge 60 as shown in FIG. 11. The fluid supply cartridge 20 provides electrical control communication to the ejection head 10 through electrical contacts 62 on a flexible circuit 64 that is connected by electrical tracing 66 to the substrate 14. The fluid supply cartridge 60 may be used to provide fluid ejection droplets on a medium. In one embodiment, the fluid supply cartridge 60 is an ink cartridge that is attached to an ink jet printer 68 as shown in FIG. 12.

It is contemplated, and will be apparent to those skilled in the art from the preceding description and the accompanying drawings, that modifications and changes may be made in the embodiments of the disclosure. Accordingly, it is expressly intended that the foregoing description and the accompanying drawings are illustrative of exemplary embodiments only, not limiting thereto, and that the true spirit and scope of the present disclosure be determined by reference to the appended claims.

What is claimed is:

1. A nozzle plate for a micro-fluid ejection head, the nozzle plate comprising a photoimageable hydrophobic polycyclic polyolefin layer derived from an epoxy functionalized polynorbornene attached to an ejection head structure.

2. The nozzle plate of claim 1, wherein the hydrophobic layer has a thickness ranging from about 0.02 to about 50 microns.

3. The nozzle plate of claim 1, the nozzle plate comprises a material selected from the group consisting of polyimide and a negative photoimageable polymer, and the hydrophobic layer is applied to the nozzle plate material.

4. The nozzle plate of claim 1, wherein the nozzle plate consists essentially of the hydrophobic layer comprising polynorbornene and the nozzle plate is attached to a thick film layer on a substrate providing the ejection head structure.

5. The nozzle plate of claim 4, wherein the thick film layer comprises a material derived from a hydrophilic functionalized polynorbornene.

6. The nozzle plate of claim 1, wherein the hydrophobic layer has a glass transition temperature of greater than about 150° C.

7. The nozzle plate of claim 1, wherein the hydrophobic layer has a number average molecular weight ranging from about 40,000 to about 80,000.

8. The nozzle plate of claim 1, wherein the hydrophobic layer, in the absence of fluorine or silicone groups, has a water contact angle of greater than 90 degrees.

9. The nozzle plate of claim 1, comprising a dry film composite layer including a first comprising the hydrophobic layer and a second layer selected from the hydrophobic layer, a hydrophilic polycyclic polyolefin layer derived from an epoxy functionalized polynorbornene, and a photoimageable epoxy resin layer wherein the dry film composite has an overall thickness ranging from about 2 to about 50 microns.

* * * * *